United States Patent
Jung

(10) Patent No.: US 7,125,771 B2
(45) Date of Patent: Oct. 24, 2006

(54) METHODS FOR FABRICATING NONVOLATILE MEMORY DEVICE

(75) Inventor: Jin Hyo Jung, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 29 days.

(21) Appl. No.: 11/024,832

(22) Filed: Dec. 30, 2004

(65) Prior Publication Data

US 2005/0142751 A1    Jun. 30, 2005

(30) Foreign Application Priority Data

Dec. 31, 2003  (KR) ................ 10-2003-0101097
Dec. 31, 2003  (KR) ................ 10-2003-0101099

(51) Int. Cl.
*H01L 21/336* (2006.01)

(52) U.S. Cl. ............... 438/261; 438/264; 438/257

(58) Field of Classification Search ........... 438/261, 438/264, 265, 266, 201, 211, 257, 267, 563
See application file for complete search history.

(56) References Cited

U.S. PATENT DOCUMENTS

| | | | |
|---|---|---|---|
| 6,093,945 A | 7/2000 | Yang | |
| 6,130,132 A * | 10/2000 | Hsieh et al. | 435/264 |
| 6,197,639 B1 | 3/2001 | Lee et al. | |
| 6,573,557 B1 | 6/2003 | Watanabe | |
| 6,635,532 B1 | 10/2003 | Song et al. | |
| 6,737,322 B1 * | 5/2004 | Inoue et al. | 438/261 |
| 6,798,015 B1 * | 9/2004 | Kasuya | 438/261 |
| 2002/0145914 A1 | 10/2002 | Ogura et al. | |
| 2003/0166320 A1 * | 9/2003 | Kasuya | 438/261 |
| 2003/0235952 A1 * | 12/2003 | Shibata | 438/261 |

OTHER PUBLICATIONS

Copy of German Office Action mailed on Mar. 9, 2006 in counterpart German Patent Application No. 10 2004 063 609.5-33.

* cited by examiner

*Primary Examiner*—Walter L. Lindsay
(74) *Attorney, Agent, or Firm*—Finnegan, Henderson, Farabow, Garrett, & Dunner, L.L.P.

(57) ABSTRACT

Methods of fabricating a nonvolatile memory device are disclosed. A disclosed method comprises forming a first buffer oxide layer and a first buffer nitride layer on a semiconductor substrate; forming an opening through the first buffer nitride layer and the first buffer oxide layer; forming sidewall floating gates on sidewalls within the opening; forming a block oxide layer; forming a polysilicon main gate over the sidewall floating gates; forming first sidewall spacers on the sidewalls of the polysilicon main gate and the sidewall floating gates; forming common source and drain regions in the semiconductor substrate; filling the gap between the polysilicon main gates with an insulating layer; depositing a polysilicon layer for a word line; patterning a word line and the polysilicon main gate in the direction of a word line; and forming second sidewall spacers on the sidewalls of the word line and the polysilicon main gate.

21 Claims, 9 Drawing Sheets a (PRIOR ART)

METHODS FOR FABRICATING NONVOLATILE MEMORY DEVICE

BACKGROUND OF THE INVENTION

1. Field of the Invention

The present invention generally relates to semiconductor devices and, more particularly, to methods for fabricating a nonvolatile memory device.

2. Background of the Related Art

Generally, semiconductor memory devices are divided into volatile memories and nonvolatile memories. The volatile memories, including chiefly random access memories (RAM) such as dynamic random access memories (DRAM) and static random access memories (SRAM), retain their memory data when the power is turned on, but lose the stored data when the power is turned off. In contrast, the nonvolatile memories, including chiefly read only memories (ROM), retain their memory data even after the power is turned off.

The nonvolatile memories may be subdivided into ROM, programmable ROM (PROM), erasable PROM (EPROM), and electrically erasable PROM (EEPROM).

From the view point of process technology, the nonvolatile memories may be divided into a floating gate family and a metal insulator semiconductor (MIS) family comprising a multi-layer of two or more dielectrics. The memory devices of the floating gate family use potential wells to achieve memory characteristics. For instance, EPROM tunnel oxide (ETOX) structure and split gate structure are widely applied to flash EEPROM. The split gate structure comprises two transistors in one cell. On the other hand, the memory devices of the MIS family perform memory functions by using traps positioned on a bulk dielectric, the interface between dielectrics, and the interface between the dielectric and the semiconductor. At present, the MONOS (metal oxide nitride oxide semiconductor)/SONOS (semiconductor oxide nitride oxide semiconductor) structure is chiefly being employed for flash EEPROM.

FIG. 1 is a cross-sectional view of a flash memory cell structure formed by using a conventional technology. Referring to FIG. 1, a gate oxide layer 12 is deposited on a semiconductor substrate 10 having at least one device isolation layer 11. A first polysilicon layer 13 is deposited on the gate oxide layer 12. The first polysilicon layer 13 is used as a floating gate. A dielectric layer 15 and a second polysilicon layer 16 are sequentially deposited on the first polysilicon layer 13. The second polysilicon layer 16 is used as a control gate. A metal layer 17 and a nitride layer 18 are sequentially deposited on the second polysilicon layer 16. A cell structure is patterned to complete a flash memory cell by removing some portion of the gate oxide layer 12, the first polysilicon layer 13, the dielectric layer 15, the second polysilicon layer 16, the metal layer 17, and the nitride layer 18.

For a conventional process of fabricating a NOR flash memory, a self-aligned source (SAS) process or a self-aligned shallow trench isolation (SA-STI) process is chiefly adopted to minimize the unit cell area of the NOR flash memories. Although the SAS or the SA-STI process or even both processes are applied, the unit cell area cannot be reduced down to $4F^2$ (F is the minimum feature size of the manufacturing process), the minimum area of a NANA flash cell, because a bit line contact should be formed. Moreover, in fabricating a device with 2 bit sidewall floating gates, bit line contacts have to be formed on source and drain regions to form bit lines. Therefore, an additional area is required to form the bit line contacts. As a result, a cell structure without a bit line contact should be developed to minimize the unit cell area.

SUMMARY OF THE INVENTION

Accordingly, the present invention is directed to methods for fabricating a nonvolatile memory device that substantially obviates one or more problems due to limitations and disadvantages of the related art.

An object of the present invention is to provide methods of fabricating a nonvolatile memory device which can achieve a NOR flash cell with the minimum area of $2F^2$ without using a SAS process or an SA-STI process.

Another object of the present invention is to provide methods of fabricating a nonvolatile memory device which can achieve a NOR flash cell with the minimum area of $2F^2$ and further reduce the unit cell size to $1F^2$ by applying multi-level bit operation using a self-convergence feature of an erase threshold voltage and a select gate feature of a main gate.

To achieve these objects and other advantages and in accordance with the purpose of the invention, as embodied and broadly described herein, the present invention provides a method for fabricating a nonvolatile memory device comprising: forming a gate oxide layer, a polysilicon layer for first control gates, a buffer oxide layer, and a buffer nitride layer on a semiconductor substrate; patterning first control gates in the direction of a column by removing some portion of the buffer nitride layer, the buffer oxide layer, and the polysilicon layer for first control gates; forming sidewall floating gates on the sidewalls of the first control gates, forming common source and drain regions in the semiconductor substrate; removing the sidewall floating gates formed between word lines by patterning the semiconductor substrate in the direction of a row; depositing and planarizing an insulating layer over the semiconductor substrate including the first control gates and the sidewall floating gates so as to completely fill the gap between the first control gates; removing the buffer nitride layer and the buffer oxide layer on the first control gates; depositing a polysilicon layer for second control gates over the semiconductor substrate including the first control gates and the insulating layer; forming stack gates by removing some portion of the first control gates and the polysilicon layer for second control gates in the direction of a word line, each stack gate comprising one first control gate and one second control gate; and forming sidewall spacers on the sidewalls of the stack gates.

In another aspect of the present invention, the present invention provides a method for fabricating a nonvolatile memory device comprising: forming a first buffer oxide layer and a first buffer nitride layer on a semiconductor substrate; removing some portion of the first buffer nitride layer and the first buffer oxide layer to form an opening through the first buffer nitride layer and the first buffer oxide layer; forming sidewall floating gates on the sidewalls of the first buffer nitride layer within the opening; forming a block oxide layer on the semiconductor substrate including the sidewall floating gates and the first buffer nitride layer; sequentially forming a polysilicon layer for a polysilicon main gate and a second buffer nitride layer on the block oxide layer; forming a polysilicon main gate by removing some portion of the second buffer nitride layer and the polysilicon layer for a polysilicon main gate; forming first sidewall spacers on the sidewalls of the polysilicon main gate and the sidewall floating gates; forming common source and drain regions in the semiconductor substrate by performing an ion implantation process; depositing and planarizing an insulating layer over the semiconductor substrate so as to completely fill the gap between the polysilicon main gates; depositing a polysilicon layer for a word line over the semiconductor substrate including the insulating layer; patterning a word line and the polysilicon main gate in the direction of a word line by removing some portion of the polysilicon layer for a word line and the polysilicon main gate; and forming second sidewall spacers on the sidewalls of the word line and the polysilicon main gate.

It is to be understood that both the foregoing general description and the following detailed description of the present invention are exemplary and explanatory and are intended to provide further explanation of the invention as claimed.

DETAILED DESCRIPTION OF THE PREFERRED EMBODIMENT

Reference will now be made in detail to the preferred embodiments of the present invention, examples of which are illustrated in the accompanying drawings.

Figure 1:
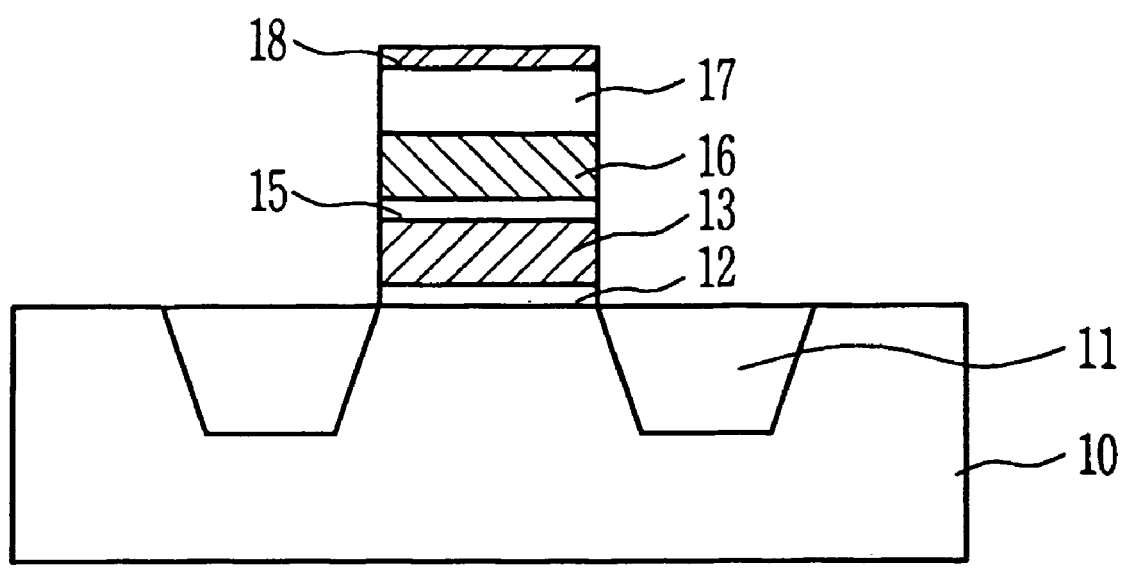
FIG. 1 is a cross-sectional view of a flash memory cell structure formed in accordance with a conventional technology.
Figure 2:
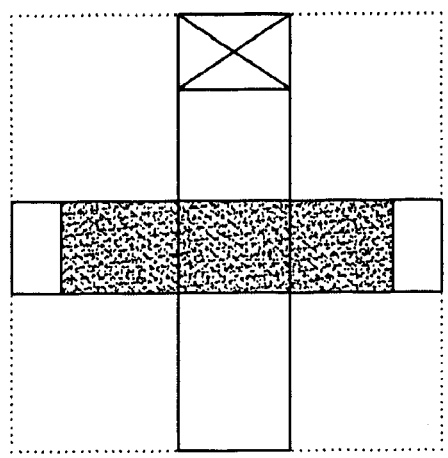
FIG. 2 is a drawing comparing unit cell areas of a NOR flash memory in accordance with a conventional technology and a nonvolatile memory device fabricated in accordance with the present invention.
Figure 2:
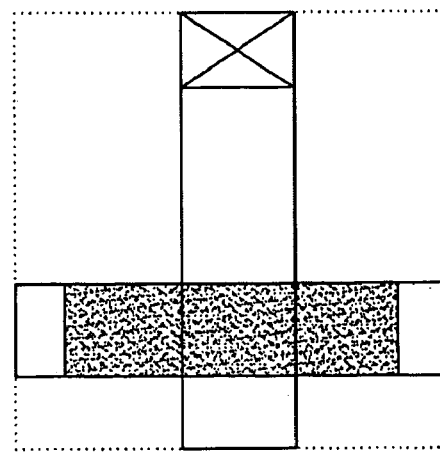
Figure 2:
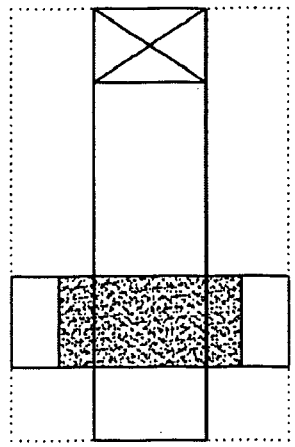
Figure 2:
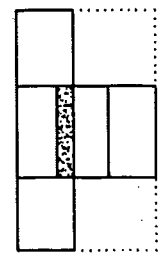

FIG. 2 is a drawing comparing unit cell areas of a NOR flash memory according to a conventional technology and a nonvolatile memory device fabricated in accordance with the present invention.

Referring to FIG. 2-a, a NOR flash unit cell area with a bit contact is about $10.5F^2$ when both a SAS and an SA-STI process are not applied.

Referring to FIG. 2-b, a NOR flash unit cell area with a bit contact is about $9F^2$ when only a SAS process is applied. Thus, the unit cell area can be reduced by about 15% compared to that of FIG. 2-a due to the SAS process.

Referring to FIG. 2-c, a NOR flash unit cell area with a bit contact is about $6F^2$ when both a SAS process and an SA-STI process are applied. Thus, the unit cell area can be reduced by about 43% compared to that of FIG. 2-a and about 33% compared to that of FIG. 2-b.

Referring to FIG. 2-d, a NOR flash unit cell with 2-bit sidewall floating gates according to the present invention, which does not have a bit contact, has an area of about $2F^2$. The $2F^2$ is the half of a conventional NAND flash unit cell area, which is fabricated by using the SA-STI process. Thus, the area of the NOR flash unit cell according to the present invention can be reduced by about 81% compared to that of FIG. 2-a, about 78% compared to that of FIG. 2-b, and about 67% compared to that of FIG. 2-c. In another embodiment of the present invention, the area of a NOR flash unit cell with 2-bit sidewall floating gates can be reduced to $1F^2$ because one transistor can achieve 4-bit when multi-level operation is performed by using a self-convergence feature of an erase threshold voltage and a select gate feature of a main gate. The $1F^2$ is a quarter of the minimum area ($4F^2$) of a NAND flash unit cell fabricated by using an SA-STI process. Thus, the area of a NOR flash unit cell can be reduced by about 90.5% compared to that of FIG. 2-a, about 89% compared to that of FIG. 2-b, and about 83% compared to that of FIG. 2-c.

Figure 3:
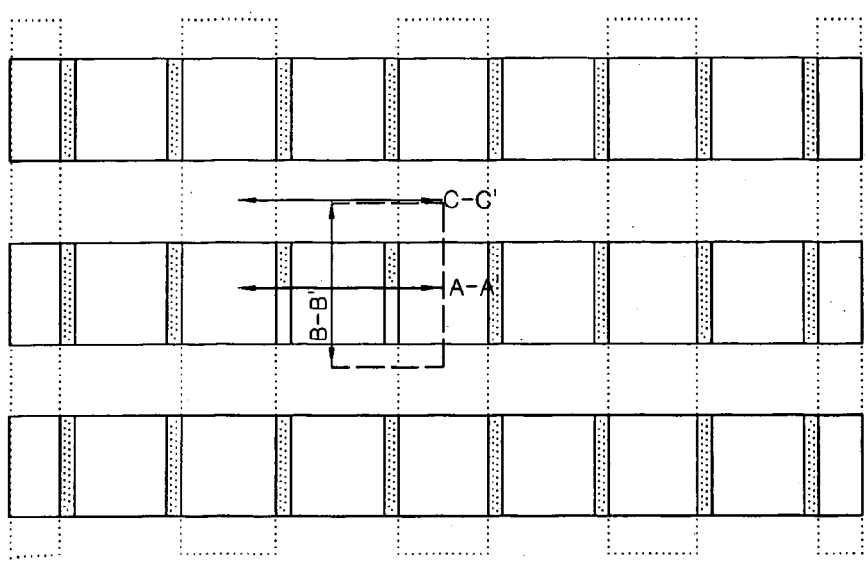
FIG. 3 illustrates a cell array layout of a nonvolatile memory device fabricated in accordance with the teachings of the present invention.

FIG. 3 illustrates a cell array layout of a nonvolatile memory device according to the present invention. FIGS. 4a through 4h and FIGS. 5a through 5i are cross-sectional views of FIG. 3 taken along the lines A–A', B–B', and C–C', each from left to right. Example processes of fabricating a nonvolatile memory device are now described referring to FIGS. 4a through 4h and FIGS. 5a through 5i.

FIGS. 4a through 4h are cross-sectional views illustrating an example process of fabricating a nonvolatile memory device in accordance with the present invention.

Figure 4A:
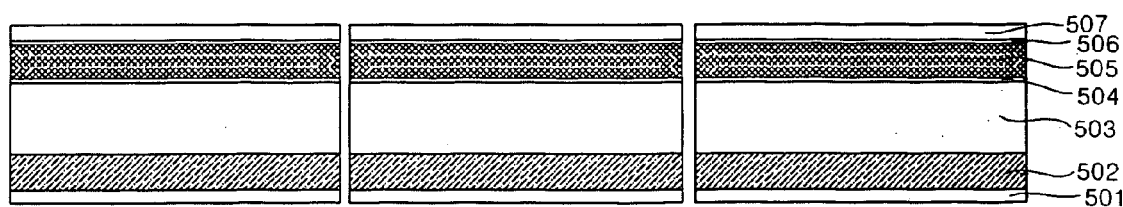
FIGS. 4a through 4h are cross-sectional views illustrating an example process of fabricating a nonvolatile memory device performed in accordance with the teachings of the present invention.

Referring to FIG. 4a, a p-type semiconductor substrate 501 is prepared. A deep n-well 502 and a deep p-well 503 are formed in the p-type semiconductor substrate 501 by using ion implantation processes. When the p-well 503 is formed, ions for the adjustment of a threshold voltage and the prevention of punch-through are implanted together. Next, a gate oxide layer 504 is grown on the semiconductor substrate 501. The oxide layer 504 preferably has a thickness between about 10 Å and about 200 Å. A polysilicon layer 505 for first control gates, a buffer oxide layer 506, and a buffer nitride layer 507 are sequentially deposited on the gate oxide layer 504. The polysilicon layer 505 is preferably formed of doped polysilicon. In another embodiment, the polysilicon layer 505 may be formed by depositing undoped polysilicon and doping it with impurities by an ion implantation process. The polysilicon layer 505 preferably has a thickness between about 500 Å and about 4000 Å. The buffer oxide layer 506 preferably has a thickness between about 100 Å and about 200 Å. The buffer nitride layer 507 preferably has a thickness between about 100 Å and about 2000 Å.

Figure 4B:
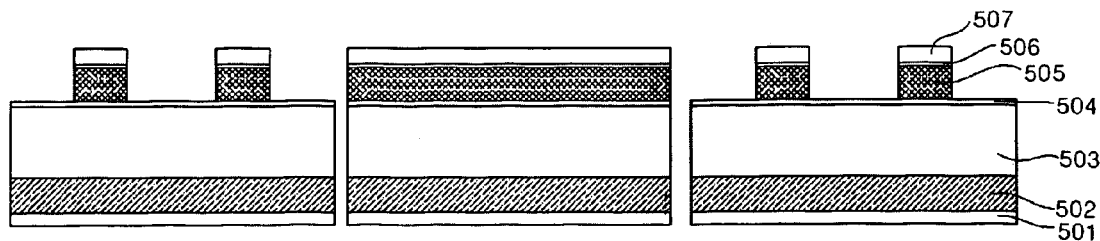

Referring to FIG. 4b, first control gates 505 are patterned in the direction of the line B–B' by removing some portion of the buffer nitride layer, the buffer oxide layer and the polysilicon layer.

Figure 4C:
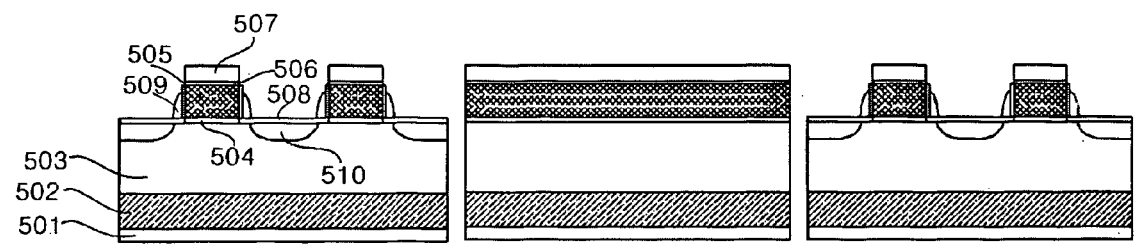

Referring to FIG. 4c, the gate oxide layer exposed between the first control gates 505 is removed. Then, a tunnel oxide layer 508 is formed on the semiconductor substrate between first control gates 505 by an oxide growth process. Here, coupling oxide layers are formed on the sidewalls of the first control gates 505 at the same time. After a polysilicon layer for sidewall floating gates is deposited over the resulting structure, a blanket etching process is performed to form sidewall floating gates 509 on the sidewalls of the first control gates 505. In the illustrated example process, the polysilicon layer for sidewall floating gates is over-etched so that the top of each sidewall floating gate 509 is lower than that of the first control gate 505 in order to prevent a short circuit between the sidewall floating gate and a second control gate to be formed by a later unit process. The polysilicon layer for sidewall floating gates preferably has a thickness between about 100 Å and about 1500 Å. After the sidewall floating gates 509 are formed, an oxide layer may be additionally formed by an oxide growth process or deposited by using a chemical vapor deposition (CVD) process on the sidewall floating gates 509. Next, common source and drain regions 510 are formed in the semiconductor substrate by performing an ion implantation process using the first control gates 505 and the sidewall floating gates 509 as a mask.

Figure 4D:
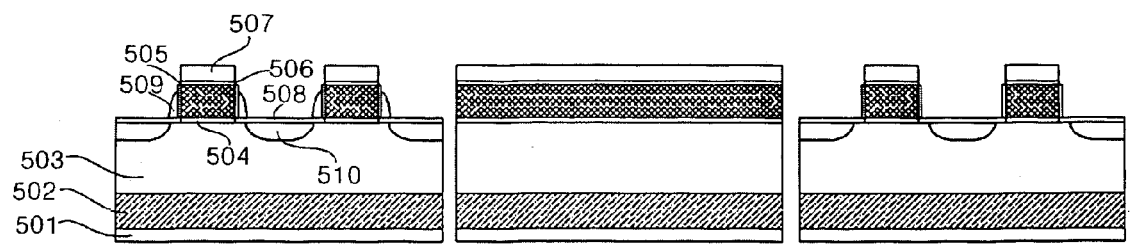

Referring to FIG. 4d, the sidewall floating gates formed between word lines are removed by using a wet etching or a dry etching. Here, instead of performing the ion implantation process for forming common source and drain regions as in FIG. 4c, an ion implantation process may be performed after the sidewall floating gates between word lines are removed, forming smaller common source and drain regions, thereby further reducing the resistance of the source and drain regions.

Figure 4E:
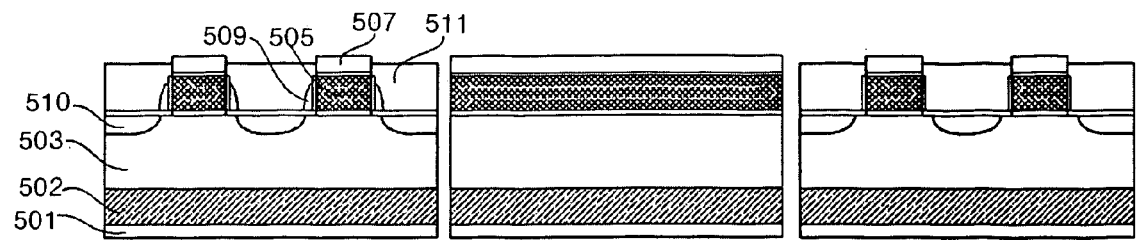

Referring to FIG. 4e, a gap-fill oxide layer 511 is deposited over the structure of FIG. 4d by using an atmospheric pressure chemical vapor deposition (APCVD) or a high-density plasma chemical vapor deposition (HDP-CVD) process. The gap-fill oxide layer 511 is formed so as to fill the gap between the first control gates 505. The gap-fill oxide layer 511 is then planarized to be recessed by using an etch-back process until the top surface of the gap fill oxide layer 511 reaches the middle part of the sidewall of the buffer nitride layer 507. Instead of the etch-back process, a chemical mechanical polishing (CMP) process may be used.

Figure 4F:
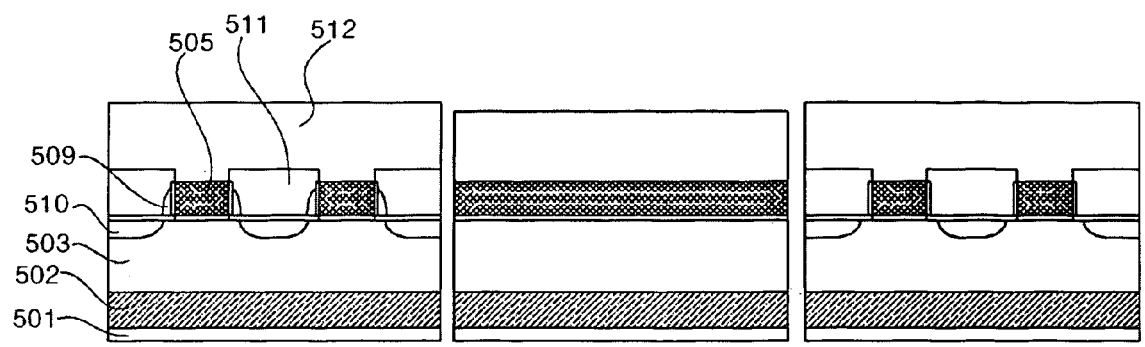

Referring to FIG. 4f, the buffer nitride layer 507 and the buffer oxide layer 506 on the first control gates 505 are removed by using a wet etching process. A polysilicon layer 512 for second control gates is then deposited over the resulting structure. The polysilicon layer 512 is preferably formed of doped polysilicon. In another embodiment, the polysilicon layer 512 may be formed by depositing undoped polysilicon and doping it with impurities by an ion implantation process. The polysilicon layer 512 preferably has a thickness between about 500 Å and about 3000 Å.

Figure 4G:
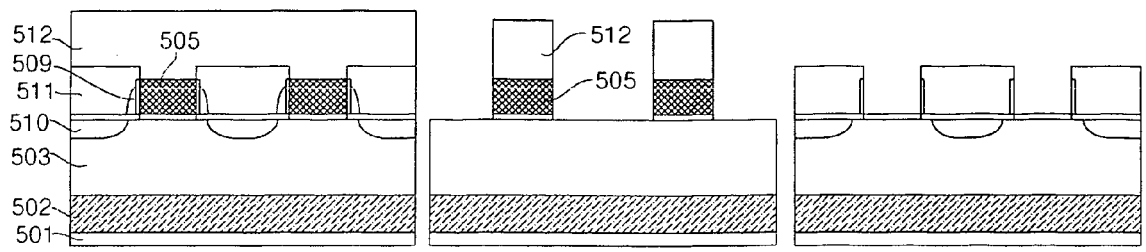

Referring to FIG. 4g, stack gates consisting of a first control gate 505 and a second control gate 512 are formed by etching the first control gates formed before and the polysilicon layer for second control gates in the direction of a word line. The second control gates 512 interconnect the first control gates 505 formed before in the direction of a word line. After the second control gates 512 are formed in the direction of a word line, an oxide growth process may be additionally performed. In addition, an ion implantation process may be additionally performed to increase the threshold voltage of parasitic transistors or field transistors, which are formed from the sidewalls of the first control gates toward the semiconductor substrate.

Figure 4H:
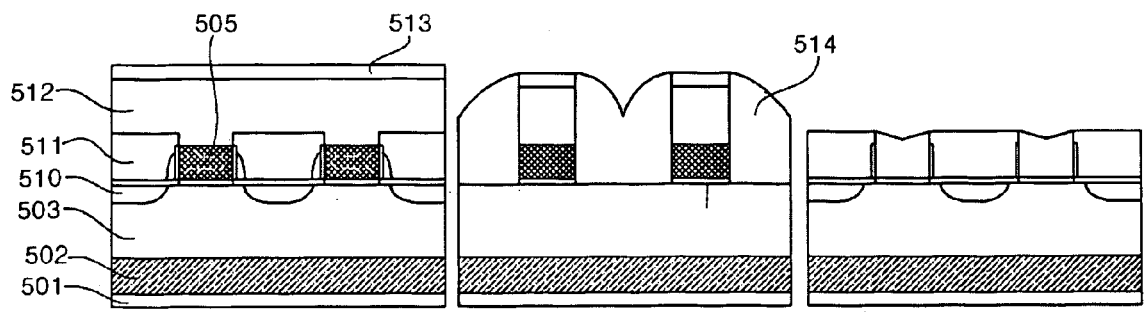

Referring to FIG. 4h, after an insulating layer is deposited over the structure of FIG. 4g, a blanket etching process is performed to form sidewall spacers 514 on the sidewalls of the stack gates. The insulating layer is preferably formed of oxide or nitride. Next, a silicide process is performed to selectively form silicide 513 on the second control gates 512. In another embodiment, instead of forming the sidewall spacers 514, a gap-fill oxide layer is deposited so as to completely fill the gap between the stack gates by using an APCVD or an HDP process and then planarized so that the top surface of a word line is exposed. A silicide process is then performed to selectively form silicide on the word line. Subsequently, known processes are performed to complete a nonvolatile memory device.

Accordingly, by forming device isolation regions using a p-well and common source and drain regions without performing an STI process, the illustrated example process can effectively reduce the size of a NOR flash cell without using a SAS or an SA-STI process. Moreover, the illustrate example process effectively embodies sidewall floating gates by which 2-bit can be achieved using just one transistor. Consequently, the illustrated example process can reduce the area of a NOR flash memory unit cell by 67%~81% compared to that of a conventional NOR flash memory unit cell with a bit contact because the illustrated example process dose not need to form a bit contact in each unit cell. In addition, by forming a NOR flash cell with 2-bit sidewall floating gates without a bit contact, the illustrated example process can reduce the area of a NOR flash memory unit cell to a half of that of a NAND flash unit cell.

FIGS. 5a through 5i are cross-sectional views illustrating another example process of fabricating a nonvolatile memory.

Figure 5A:
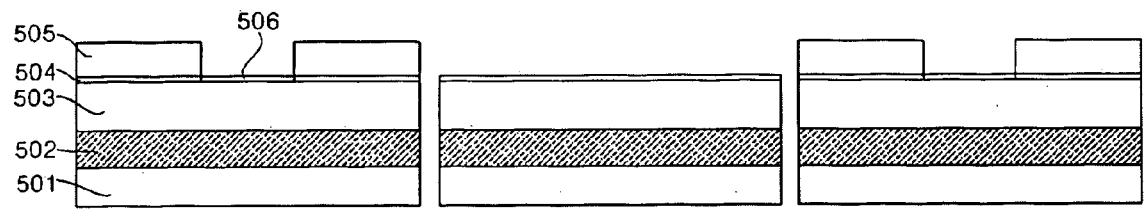
FIGS. 5a through 5i are cross-sectional views illustrating another example process of fabricating a nonvolatile memory device performed in accordance with the teachings of the present invention.

Referring to FIG. 5a, a p-type semiconductor substrate 501 is prepared. A deep n-well 502 and a p-well 503 are formed in the semiconductor substrate 501 by performing ion implantation processes. When the p-well 503 is formed, ions for the adjustment of a threshold voltage and the prevention of punch-through are implanted together. Next, a first buffer oxide layer 504 is formed on the semiconductor substrate 501. Instead of forming the first buffer oxide layer 504, the oxide layer used during the ion implantation processes for the well formation may be employed as the first buffer oxide layer. A first buffer nitride layer 505 is then deposited on the first buffer oxide layer 504. The first buffer nitride layer 505 and the first buffer oxide layer 504 are patterned in the direction of a word line. A tunnel oxide layer 506 is formed on the semiconductor substrate exposed by the patterning. The first buffer oxide layer 504 preferably has a thickness between about 50 Å and about 300 Å. The first buffer nitride layer 505 preferably has a thickness between about 100 Å and about 2000 Å. The tunnel oxide layer 506 preferably has a thickness between about 30 Å and about 300 Å.

Figure 5B:
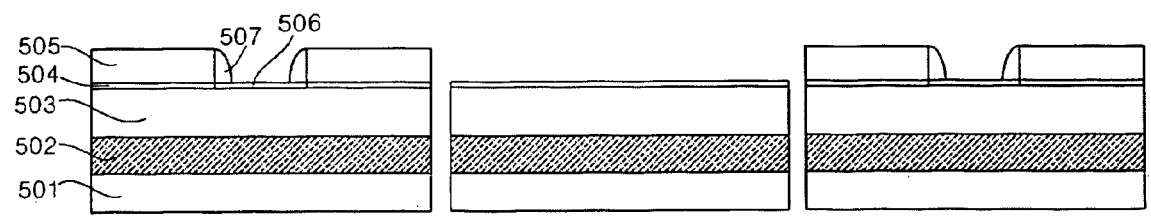

Referring to FIG. 5b, after a polysilicon layer for sidewall floating gates is deposited over the structure of FIG. 5a, a blanket etching process is performed to form sidewall floating gates 507 on the sidewalls of the first buffer nitride layer 505. The polysilicon layer for sidewall floating gates preferably has a thickness between about 100 Å and 1500 Å.

Figure 5C:
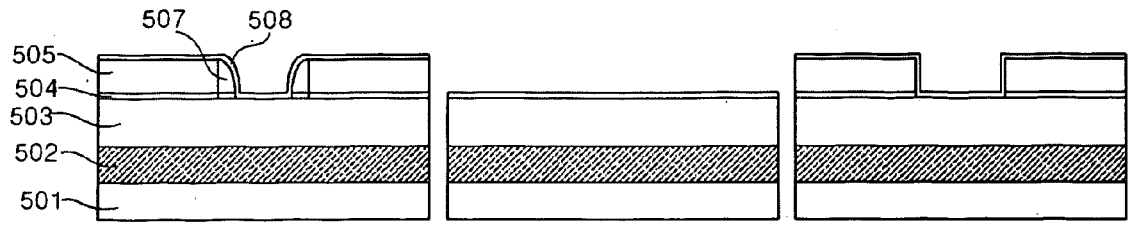

Referring to FIG. 5c, after the tunnel oxide layer between the sidewall floating gates 507 is removed, a block oxide layer 508 is formed along the surface of the resulting structure. The block oxide layer 508 is a multi-layer comprising a first block oxide layer and a second block oxide layer. In the illustrated example process, the first and the second block oxide layers formed on the sidewall floating gates 507 are used for the convergence of an erase threshold voltage during erase operation. The first and the second block oxide layers formed on the silicon substrate are used as a main gate oxide layer. The first block oxide layer is preferably formed of $Al_2O_3$ or $Y_2O_3$ and has a thickness between about 40 Å and about 400 Å. The second block oxide layer is formed of $SiO_2$ and has a thickness between about 20 Å and about 200 Å. Next, after the region between word lines is opened by using a patterning process, the first block oxide layer, the second block oxide layer, and the sidewall floating gates between the word lines are removed by performing an etching process.

Figure 5D:
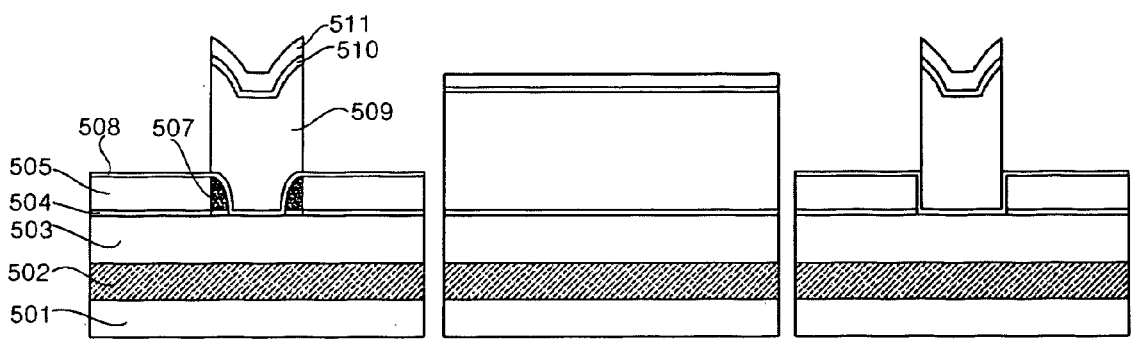

Referring to FIG. 5d, a polysilicon layer for a main gate, a second buffer oxide layer 510, and a second buffer nitride layer 511 are sequentially deposited on the structure of FIG. 5c. Some portion of the polysilicon layer, the second buffer oxide layer, and the second buffer nitride layer is then removed to form a main gate 509. The polysilicon layer for a main gate is preferably formed of doped polysilicon. In another embodiment, the polysilicon layer may be formed by depositing undoped polysilicon and doping it with impurities by an ion implantation process. The polysilicon layer for a main gate preferably has a thickness between about 500 Å and about 4000 Å. The deposition of the second buffer oxide layer may be omitted.

Figure 5E:
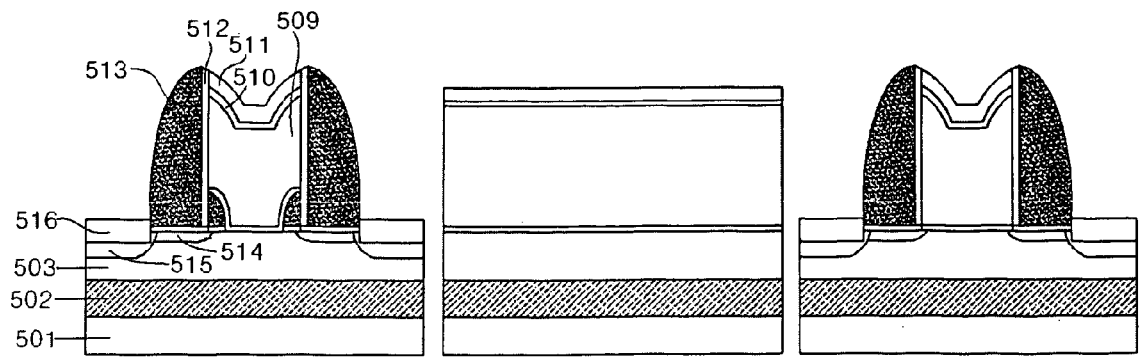

Referring to FIG. 5e, the first buffer nitride layer 505 is removed by using a wet etching process. An oxide layer 512 is formed on the sidewalls of the main gate 509 and the sidewall floating gates 507. An ion implantation process is performed using the main gate 509 as a mask to form lightly doped drains (LDD) 514 or extension regions of source and drain regions in the semiconductor substrate. After an insulating layer is deposited over the resulting structure, a blanket etching process is performed for the insulating layer to form sidewall spacers 513 on the sidewalls of the main gate 509. Next, an ion implantation process is performed using the main gate 509 and the sidewall spacers 513 as a mask to form source and drain regions 515 in the semiconductor substrate. Silicide 507 is formed on the source and drain regions 515 by performing a silicide process. The silicide 507 is used to reduce the resistance of the source and drain regions 515. In another embodiment, only source and drain regions without the LDD 514 may be formed by one ion implantation process before the sidewall spacers 513 are formed. The sidewall spacers 513 are preferably formed of oxide, nitride, or both oxide and nitride. The silicide process of forming silicide on the source and drain regions 515 may be omitted.

Figure 5F:
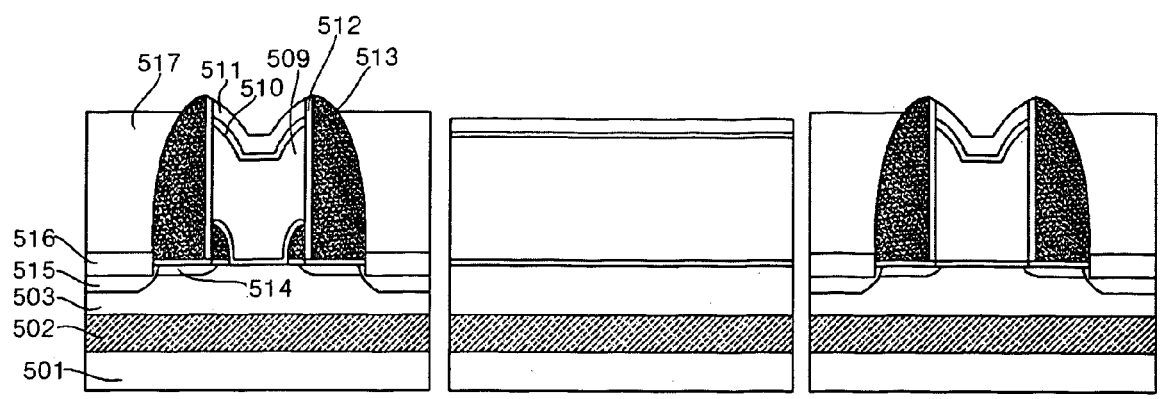

Referring to FIG. 5f, a gap-fill oxide layer 517 is deposited over the structure of FIG. 5e so as to fill the gap between the main gates by using an APCVD or an HDP-CVD process, and planarized by using an etch-back process. In the illustrated example process, the gap-fill oxide layer 517 is recessed until the top surface of the gap-fill oxide layer 517 reaches the middle part of the sidewalls of the second buffer nitride layer 511. Instead of the etch-back process, a CMP process may be used.

Figure 5G:
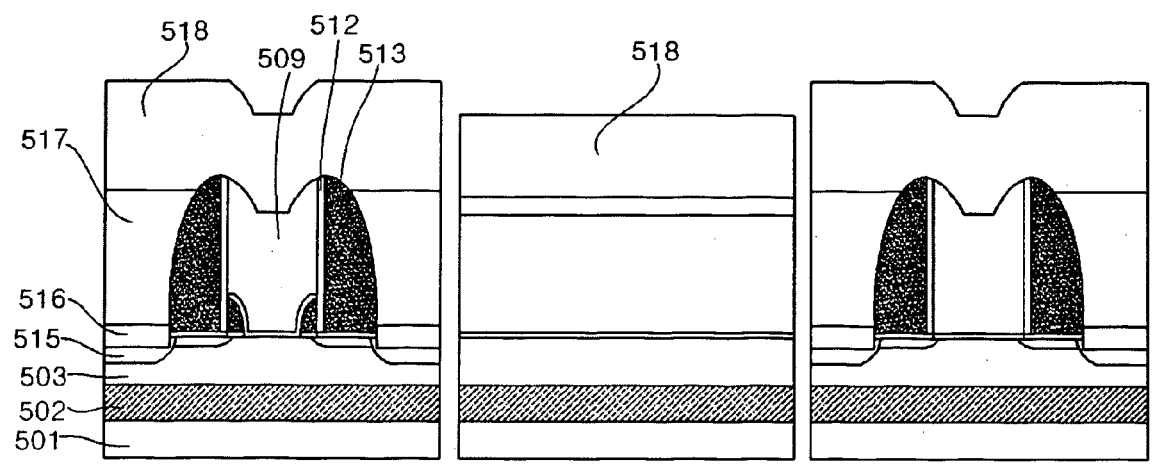

Referring to FIG. 5g, the second buffer nitride layer 511 and the second buffer oxide layer 510 on the main gate 509 are removed by using a wet etching process. A polysilicon layer 518 for a word line is deposited over the resulting structure. The polysilicon layer 518 for a word line is preferably formed of doped polysilicon. In another embodiment, the polysilicon layer 518 may be formed by depositing undoped polysilicon and doping it with impurities by an ion implantation process. The polysilicon layer 518 preferably has a thickness between about 500 Å and about 3000 Å.

Figure 5H:
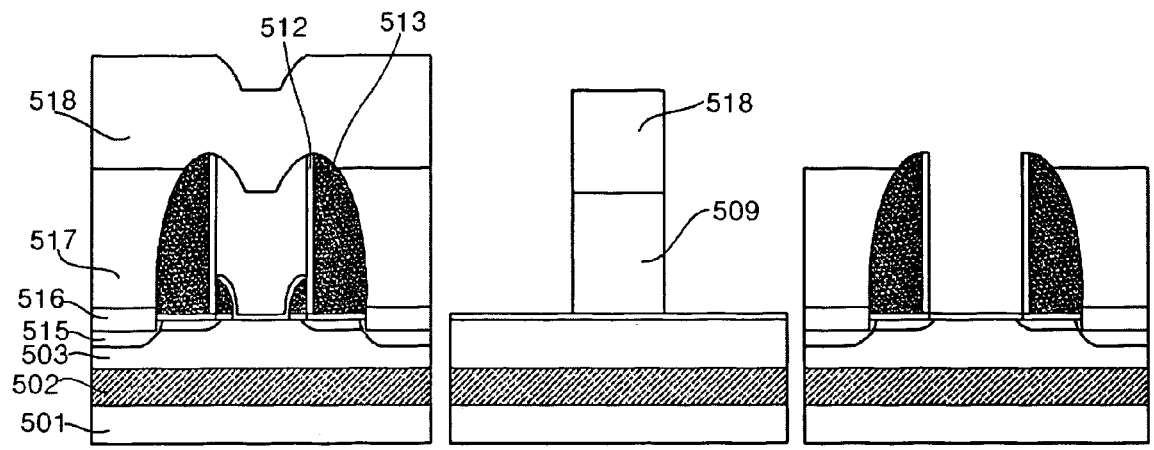

Referring to FIG. 5h, the polysilicon layer for a word line and the main gate formed before is patterned in the direction of a word line. As a result, a stack gate consisting of a word line 518 and a main gate 509 is formed in the direction of the line B–B'. The word line 518 interconnects the main gates 509 in the direction of a word line. After the stack gate is formed, an oxide growth process may be additionally performed. In another embodiment, to increase the threshold voltage of parasitic transistors or field transistors formed from the sidewalls of the main gate 509 toward the silicon substrate, an ion implantation process may be performed using the word line 518 as a mask.

Figure 5I:
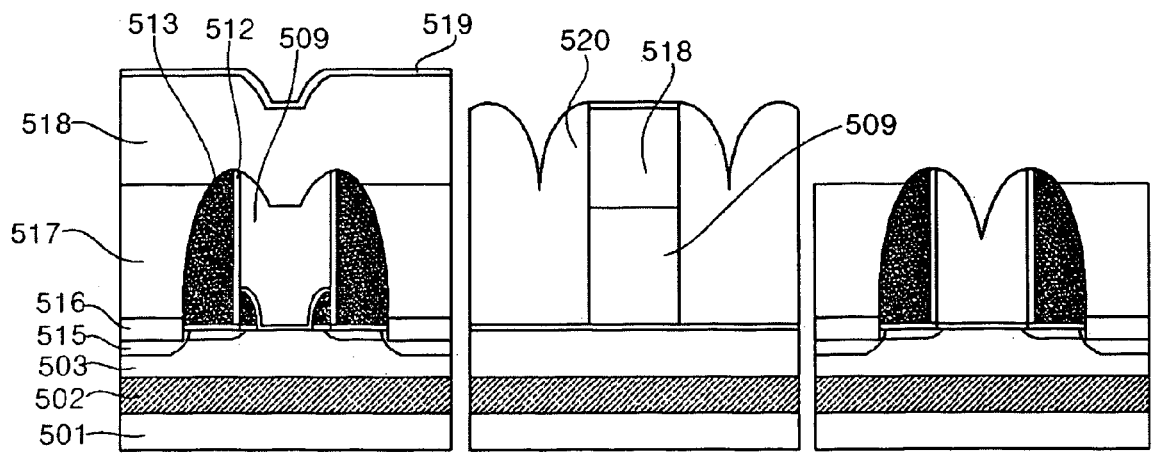

Referring to FIG. 5i, after an insulating layer for sidewall spacers is deposited over the structure of FIG. 5h, a blanket etching process is performed for the insulating layer to form sidewall spacers 520 on the sidewalls of the stack gate. Next, a silicide process is performed to selectively form silicide 519 on the word line 518. The insulating layer for sidewall spacers is preferably formed of oxide, nitride, or both oxide and nitride. Subsequently, known processes are performed to complete a nonvolatile memory device.

Accordingly, the illustrated example process can achieve a NOR flash memory with 2-bit sidewall floating gates having a self-convergence feature without forming a bit line contact, thereby reducing the area of a NOR flash unit cell to $2F^2$. Moreover, by means of multi-level bit operation using the self-convergence feature of an erase threshold voltage and the select gate feature of a main gate, the illustrated example process can further reduce the area of a NOR flash unit cell to $1F^2$. As a result, the illustrated example process considerably decreases the area of a NOR flash unit cell by 83%~90.5% in comparison with the area of a conventional NOR flash unit cell.

It is noted that this patent claims priority from Korean Patent Application Serial Number 10-2003-0101097, which was filed on Dec. 31, 2003, and Korean Patent Application Number 10-2003-0101099, which was filed on Dec. 31, 2003; all of which are hereby incorporated by reference in their entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating a nonvolatile memory device comprising:

sequentially forming a gate oxide layer, a polysilicon layer for first control gates, a buffer oxide layer, and a buffer nitride layer on a semiconductor substrate;

patterning first control gates in the direction of a column by removing some portion of the buffer nitride layer, the buffer oxide layer, and the polysilicon layer for first control gates;

depositing a polysilicon layer for sidewall floating gates over the semiconductor substrate including the first control gate;

forming sidewall floating gates on the sidewalls of the first control gates by etching the polysilicon layer for sidewall floating gates;

forming common source and drain regions in the semiconductor substrate;

removing the sidewall floating gates formed between word lines by patterning the semiconductor substrate in the direction of a row;

depositing and planarizing an insulating layer over the semiconductor substrate including the first control gates and the sidewall floating gates so as to fill the gap between the first control gates;

removing the buffer nitride layer and the buffer oxide layer on the first control gates;

depositing a polysilicon layer for second control gates over the semiconductor substrate including the first control gates and the insulating layer;

forming stack gates by removing some portion of the first control gates and the polysilicon layer for second control gates in the direction of a word line, each stack gate comprising one first control gate and one second control gate; and forming sidewall spacers on the sidewalls of the stack gates.

2. A method as defined by claim 1, wherein the gate oxide layer has a thickness between about 10 Å and about 200 Å.

3. A method as defined by claim 1, wherein the polysilicon layer for first control gates has a thick between about 500 Å and about 4000 Å.

4. A method as defined by claim 1, wherein etching the polysilicon layer for sidewall floating gates is performed by using an over-etching process so that the top of each sidewall floating gate is lower than that of the first control gate.

5. A method as defined by claim 1, wherein planarizing the insulating layer is performed by using an etch-back process until the top surface of the insulating layer reaches the middle part of the sidewall of the buffer nitride layer.

6. A method as defined by claim 1, wherein the buffer oxide layer has a thickness between about 100 Å and about 200 Å.

7. A method as defined by claim 1, wherein the buffer nitride layer has a thickness between about 100 Å and about 2000 Å.

8. A method as defined by claim 1, further comprising removing the gate oxide layer on the semiconductor substrate between the first control gates and forming a tunnel oxide layer on the semiconductor substrate exposed between the first control gates before the sidewall floating gates are formed on the sidewalls of the first control gates.

9. A method as defined by claim 8, wherein forming a tunnel oxide layer on the semiconductor substrate comprises forming a coupling oxide layer on the sidewalls of the first control gates at the same time.

10. A method as defined by claim 1, wherein the second control gates interconnect the first control gates in the direction of a word line.

11. A method for fabricating a nonvolatile memory device comprising:
   sequentially forming a first buffer oxide layer and a first buffer nitride layer on a semiconductor substrate;
   removing some portion of the first buffer nitride layer and the first buffer oxide layer to form an opening through the first buffer nitride layer and the first buffer oxide layer;
   forming sidewall floating gates on the sidewalls of the first buffer nitride layer within the opening;
   forming a block oxide layer on the semiconductor substrate including the sidewall floating gates and the first buffer nitride layer;
   sequentially forming a polysilicon layer for a polysilicon main gate and a second buffer nitride layer on the block oxide layer;
   forming a polysilicon main gate by removing some portion of the second buffer nitride layer and the polysilicon layer for a polysilicon main gate;
   forming first sidewall spacers on the sidewalls of the polysilicon main gate and the sidewall floating gates;
   forming common source and drain regions in the semiconductor substrate by performing an ion implantation process;
   depositing and planarizing an insulating layer over the semiconductor substrate so as to fill the gap between the polysilicon main gates;
   depositing a polysilicon layer for a word line over the semiconductor substrate including the insulating layer;
   patterning the polysilicon layer for a word line and the polysilicon main gate in the direction of a word line by removing some portion of the polysilicon layer for a word line and the polysilicon main gate; and
   forming second sidewall spacers on the sidewalls of the word line and the polysilicon main gate.

12. A method as defined by claim 11, wherein planarizing an insulating layer over the semiconductor substrate so as to fill the gap between the polysilicon main gates is performed until the top surface of the insulating layer reaches the middle part of the sidewalls of the second buffer nitride layer.

13. A method as defined by claim 11, further comprising forming a second buffer oxide layer on the polysilicon layer for a polysilicon main gate before the second buffer nitride layer is formed.

14. A method as defined by claim 11, wherein the first buffer oxide layer has a thickness between about 50 Å and about 300 Å.

15. A method as defined by claim 11, wherein the second buffer nitride layer has a thickness between about 100 Å and about 2000 Å.

16. A method as defined by claim 11, wherein the polysilicon layer for a polysilicon main gate has a thickness between about 500 Å and about 4000 Å.

17. A method as defined by claim 11, wherein the polysilicon layer for a word line has a thickness between about 500 Å and about 3000 Å.

18. A method as defined by claim 11, wherein the word line interconnects the polysilicon main gates in the direction of the word line.

19. A method as defined by claim 11, wherein the block oxide layer is a multi-layer comprising a first block oxide layer and a second block oxide layer.

20. A method as defined by claim 19, wherein the first block oxide layer is formed of $Al_2O_3$ or $Y_2O_3$ and has a thickness between about 40 Å and about 400 Å.

21. A method as defined by claim 19, wherein the second block oxide layer is formed of $SiO_2$ and has a thickness between about 20 Å and about 200 Å.

* * * * *